United States Patent
Doan et al.

(10) Patent No.: US 7,402,518 B2
(45) Date of Patent: *Jul. 22, 2008

(54) ATOMIC LAYER DEPOSITION METHODS

(75) Inventors: Trung Tri Doan, Boise, ID (US); Guy T. Blalock, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 311 days.

This patent is subject to a terminal disclaimer.

(21) Appl. No.: 11/241,486

(22) Filed: Sep. 29, 2005

(65) Prior Publication Data

US 2006/0029738 A1  Feb. 9, 2006

Related U.S. Application Data

(62) Division of application No. 10/629,011, filed on Jul. 28, 2003, now Pat. No. 7,115,529, which is a division of application No. 10/293,072, filed on Nov. 12, 2002, now Pat. No. 7,022,605.

(51) Int. Cl.
  H01L 21/44  (2006.01)
(52) U.S. Cl. ....................................... 438/685
(58) Field of Classification Search ........................ None
  See application file for complete search history.

(56) References Cited

U.S. PATENT DOCUMENTS

| 5,874,706 | A  | 2/1999  | Ishii |
| 5,976,623 | A  | 11/1999 | DeSantolo et al. |
| 6,015,762 | A  | 1/2000  | Yamazaki et al. |
| 6,158,383 | A  | 12/2000 | Watanabe et al. |
| 6,200,893 | B1 | 3/2001  | Sneh |
| 6,343,565 | B1 | 2/2002  | Hongoh |
| 6,355,561 | B1 | 3/2002  | Sandhu et al. |
| 6,369,763 | B1 | 4/2002  | Norris et al. |

(Continued)

FOREIGN PATENT DOCUMENTS

EP  1167567 A1  1/2002

(Continued)

OTHER PUBLICATIONS

Vossen et al. (Editors), Thin Film Processes, pp. 24, 25 and 373 (Academic Press, Inc. 1978).

(Continued)

*Primary Examiner*—Scott B. Geyer
(74) *Attorney, Agent, or Firm*—Wells St. John P.S.

(57) ABSTRACT

A first precursor gas is flowed to the substrate within the chamber effective to form a first monolayer on the substrate. A second precursor gas different in composition from the first precursor gas is flowed to the first monolayer within the chamber under surface microwave plasma conditions within the chamber effective to react with the first monolayer and form a second monolayer on the substrate which is different in composition from the first monolayer. The second monolayer includes components of the first monolayer and the second precursor. In one implementation, the first and second precursor flowings are successively repeated effective to form a mass of material on the substrate of the second monolayer composition. Additional and other implementations are contemplated.

24 Claims, 7 Drawing Sheets

U.S. PATENT DOCUMENTS

| | | |
|---|---|---|
| 6,399,520 B1 | 6/2002 | Kawakami et al. |
| 6,416,822 B1 | 7/2002 | Chiang et al. |
| 6,468,924 B2 | 10/2002 | Lee et al. |
| 6,537,925 B2 | 3/2003 | Kim et al. |
| 6,620,723 B1 | 9/2003 | Byun et al. |
| 6,630,201 B2 | 10/2003 | Chiang et al. |
| 6,847,003 B2 | 1/2005 | Ishii et al. |
| 7,115,529 B2 * | 10/2006 | Doan et al. ............. 438/758 |
| 2001/0052323 A1 | 12/2001 | Yieh et al. |
| 2002/0000598 A1 | 1/2002 | Kang et al. |
| 2002/0076507 A1 | 6/2002 | Chiang et al. |
| 2002/0119673 A1 | 8/2002 | Yieh et al. |
| 2002/0197856 A1 | 12/2002 | Matsuse et al. |
| 2003/0143328 A1 | 7/2003 | Chen et al. |
| 2003/0168001 A1 | 9/2003 | Sneh |
| 2004/0018304 A1 | 1/2004 | Chung et al. |
| 2004/0038525 A1 | 2/2004 | Meng et al. |
| 2004/0089631 A1 | 5/2004 | Blalock et al. |

FOREIGN PATENT DOCUMENTS

| | | |
|---|---|---|
| EP | 03/087431 A2 | 10/2003 |
| JP | 05343334 A | 12/1993 |
| JP | 1993343334 A | 12/1993 |
| JP | 2002-305195 | 10/2002 |
| TW | 479312 C2 | 3/2002 |
| WO | 02/43114 A2 | 5/2002 |
| WO | 02/045871 A1 | 6/2002 |

OTHER PUBLICATIONS

Yamamoto et al., *Design of Radial Line Slot Antennas at 8.3 GHz for Large Area Uniform Plasma Generation*, JPN. J. Appl. Phys., vol. 38, pp. 2082-2088 (1999).

\* cited by examiner

ATOMIC LAYER DEPOSITION METHODS

RELATED PATENT DATA

This patent resulted from a divisional application of U.S. patent application Ser. No. 10/629,011, filed on Jul. 28, 2003 now U.S. Pat. No. 7,115,529, entitled "Atomic Layer Deposition Methods", and naming Trung Tri Doan, Guy T. Blalock and Gurtej S. Sandhu as inventors, the disclosure of which is incorporated by reference; which patent resulted from a divisional application of U.S. patent application Ser. No. 10/293,072, filed on Nov. 12, 2002 now U.S. Pat. No. 7,022,605, entitled "Atomic Layer Deposition Methods", and naming Trung Tri Doan, Guy T. Blalock and Gurtej S. Sandhu as inventors, the disclosure of which is incorporated by reference.

TECHNICAL FIELD

This invention relates to atomic layer deposition methods.

BACKGROUND OF THE INVENTION

Semiconductor processing in the fabrication of integrated circuitry typically includes the deposition of layers on semiconductor substrates. One such method is atomic layer deposition (ALD), which involves the deposition of successive monolayers over a substrate within a deposition chamber typically maintained at subatmospheric pressure. With typical ALD, successive monoatomic layers are adsorbed to a substrate and/or reacted with the outer layer on the substrate, typically by the successive feeding of different deposition precursors to the substrate surface.

An exemplary ALD method includes feeding a single vaporized precursor to a deposition chamber effective to form a first monolayer over a substrate received therein. Thereafter, the flow of the first deposition precursor is ceased and an inert purge gas is flowed through the chamber effective to remove any remaining first precursor which is not adhering to the substrate from the chamber. Subsequently, a second vapor deposition precursor, different from the first, is flowed to the chamber effective to form a second monolayer on/with the first monolayer. The second monolayer might react with the first monolayer. Additional precursors can form successive monolayers, or the above process can be repeated until a desired thickness and composition layer has been formed over the substrate.

SUMMARY

The invention comprises atomic layer deposition methods. In one implementation, a semiconductor substrate is positioned within an atomic layer deposition chamber. A first precursor gas is flowed to the substrate within the chamber effective to form a first monolayer on the substrate. A second precursor gas different in composition from the first precursor gas is flowed to the first monolayer within the chamber under surface microwave plasma conditions within the chamber effective to react with the first monolayer and form a second monolayer on the substrate which is different in composition from the first monolayer. The second monolayer includes components of the first monolayer and the second precursor. In one implementation, the first and second precursor flowings are successively repeated effective to form a mass of material on the substrate of the second monolayer composition. In one implementation, after the second precursor gas flowing, a third precursor gas different in composition from the first and second precursor gases is flowed to the second monolayer within the chamber effective to react with the second monolayer and form a third monolayer on the substrate which is different in composition from the first and second monolayers. In one implementation, after the second precursor gas flowing, the first precursor gas is flowed to the substrate within the chamber effective to react with the second monolayer and both a) remove a component of the second monolayer to form a third composition monolayer on the substrate which is different in composition from the first and second monolayers; and b) form a fourth monolayer of the first monolayer composition on the third composition monolayer.

Other aspects and implementations not necessarily generic to any of the above are contemplated and disclosed.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
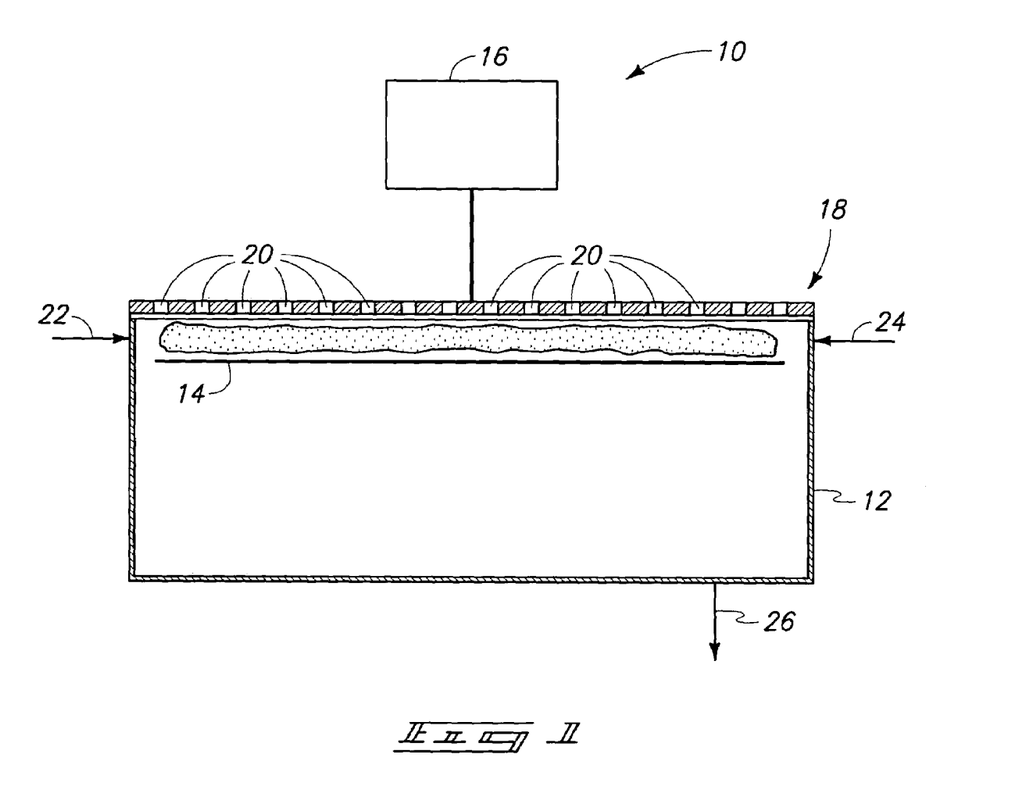
FIG. 1 is a diagrammatic sectional view of an exemplary atomic layer deposition apparatus usable in accordance with an aspect of the invention.

FIG. 1 depicts an exemplary atomic layer deposition apparatus usable in accordance with an aspect of the invention. Such an apparatus enables the generation of a surface microwave plasma within a chamber within which atomic layer deposition is conducted relative to a semiconductor substrate. In the context of this document, "surface microwave plasma" is defined as a plasma generated in a gas against a substrate being processed by transmitting microwave energy from a plurality of discrete, spaced microwave emitting sources, and whether conducted in existing or yet-to-be-developed manners. One existing manner of doing so is by use of an antenna, such as a surface plane antenna (SPA) or a radial line slot antenna (RLSA). By way of example only, examples can be found in U.S. Pat. Nos. 6,399,520 and 6,343,565, which are hereby incorporated by reference herein.

Apparatus 10 is diagrammatically depicted as comprising a deposition chamber 12 having a semiconductor substrate 14 positioned therein. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. A suitable support or mechanism (not shown) can be provided for supporting substrate 14 therein, and which might be temperature controlled, powered and/or otherwise configured for positioning a substrate 14 within chamber 12 as desired.

A suitable microwave generator 16 is operatively connected with a surface plane antenna 18 received just above deposition chamber 12. Typically, surface plane antenna 18 is comprised of a metal material having a plurality of microwave transmissive openings 20 formed therein through which microwave energy generated by source 16 passes to within chamber 12, and proximate the surface of substrate 14. The upper wall of chamber 12 over which surface plane antenna 18 is received is also, therefore, provided to be microwave transmissive. Of course, some or all of surface plane antenna 18 could be provided within deposition chamber 12. An exemplary preferred spacing from the upper surface of substrate 14 to the lower surface of surface plane antenna 18 is 65 mm. Of course, greater or small spacings can be utilized. In certain situations, spacings considerably less than 65 mm might be utilized. Further, in addition to microwave, energy generation is also contemplated in combination with microwave energy generation, and whether within or externally of chamber 12.

Exemplary precursor and/or purge gas inlets 22 and 24 are shown diagrammatically for emitting precursor and/or purge gases to within chamber 12 intermediate substrate 14 and surface plane antenna 18. A vacuum draw-down line 26 is diagrammatically shown for exhausting material from chamber 12. The FIG. 1 apparatus is diagrammatic and exemplary in construction only, with any other suitable apparatus being usable in accordance with the methodical aspects of the invention. For example, any alternate configuration, such as showerheads, multiple ports or other means, whether existing or yet-to-be developed, are also of course contemplated for getting gas to the chamber and exhausting material from the chamber.

Figure 2:
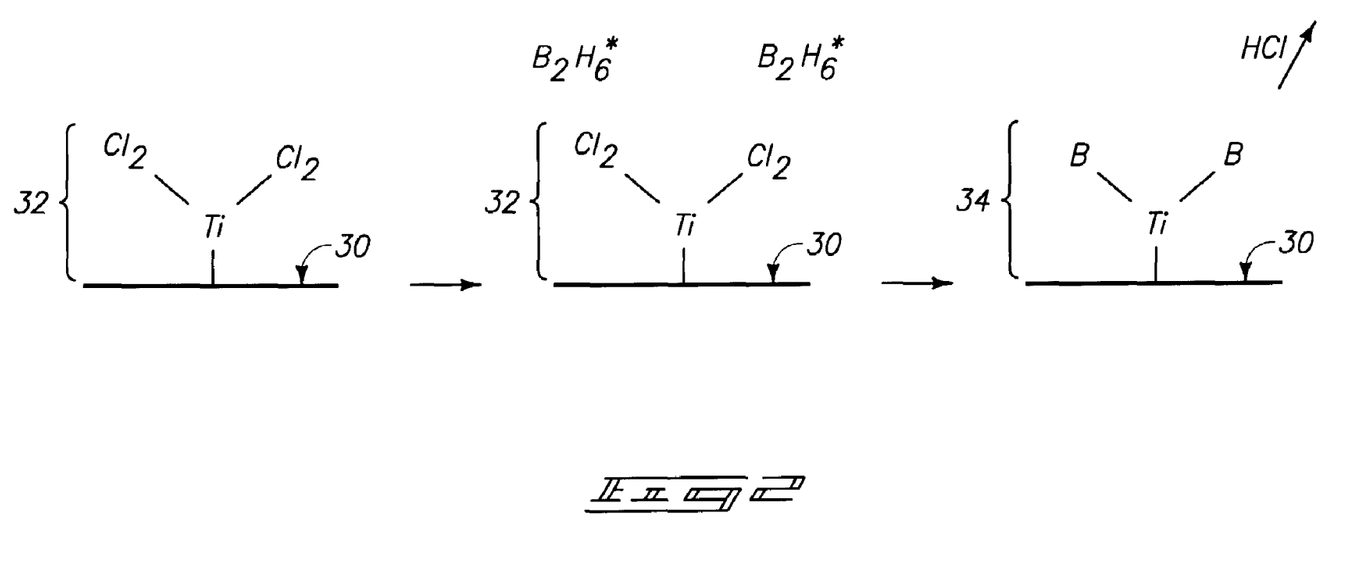
FIG. 2 is a series of diagrammatic molecular level views of an exemplary method in accordance with an aspect of the invention.

A semiconductor substrate, such as substrate 14, is positioned within an atomic layer deposition chamber. A first precursor gas is flowed to the substrate within the chamber, for example through one or both of inlets 22 and 24, effective to form a first monolayer on the substrate. By way of example only, and with respect to forming an exemplary $TiB_2$ layer, an exemplary first precursor gas includes $TiCl_4$, and, for example, alone or in combination with inert or other gases. An exemplary first monolayer produced from such $TiCl_4$ is $TiCl_x$, for example as depicted relative to FIG. 2. FIG. 2 illustrates exemplary sequential processing in an atomic layer deposition method utilizing $TiCl_4$. The far left illustrated portion of FIG. 2 depicts a suitable substrate surface 30 having a first monolayer 32 comprising $TiCl_x$ adhered thereto. Such, by way of example only, is in the form of titanium adhering to substrate surface 30 with chlorine atoms or molecules extending outwardly from the titanium.

Typically, any remaining first precursor gas would then be purged from the chamber using an inert purge gas, or by some other method. Regardless, a second precursor gas, different in composition from the first precursor gas, is then flowed to the first monolayer within the chamber under surface microwave plasma conditions within the chamber effective to react with the first monolayer and form a second monolayer on the substrate which is different in composition from the first monolayer, with the second monolayer comprising components of the first monolayer and the second precursor. In the context of this document, a gas being "different in composition" means some gas having an alternate and/or additional reactive component from the gas to which it is being compared.

The middle view in FIG. 2 depicts an exemplary preferred second precursor gas as comprising $B_2H_6$ and in an activated state under surface microwave plasma conditions. As depicted in the far right view, such is effective to react with first monolayer 32 to form a second monolayer 34 which comprises $TiB_2$, with HCl as a by-product. Second monolayer 34 comprises a component of the first monolayer (i.e., Ti) and a component of the second precursor (i.e., B).

The above described first and second precursor flowings are successively repeated effective to form a mass of material on the substrate of the second monolayer composition. The fabricated mass might comprise, consist essentially of, or consist of the second monolayer composition. For example, the invention contemplates the possibility of fabricating the mass to include materials other than solely the second monolayer composition, for example by introducing alternate first and/or second precursor gases as compared to only using the above-described first and second precursor gases in forming the mass of material on the substrate.

The exemplary above-described process has the second monolayer component from the first monolayer as being a metal in elemental form (i.e., titanium), wherein the second monolayer comprises a conductive metal compound. Further in one preferred embodiment, the mass of material is formed to be conductive. By way of example only, an alternate of such processing would be to utilize a first precursor gas comprising $TaCl_5$ to form a first monolayer comprising $TaCl_x$. In such instance, an exemplary second precursor gas comprises $NH_3$ to form a second monolayer comprising TaN. As with the first-described embodiment, inert gases, flow rates, power, temperature, pressure and any other operating parameter can be selected and optimized by the artisan, with no particular one or set of parameters being preferred in the context of the invention.

Alternately by way of example only, the second monolayer could be formed to comprise a dielectric material, and further by way of example only, the mass of material fabricated to be, insulative. For example for forming an insulative mass comprising $Al_2O_3$, exemplary gases include trimethylaluminum as a first precursor gas, and $O_3$ and/or $H_2O$ as a second precursor gas.

Also in any of the above-described and subsequent embodiments, the first precursor gas flowing can be with or without plasma within the chamber, for example with or without surface microwave plasma generation within the chamber with the first precursor gas flowing. Further, remote plasma generation could also be utilized with the first precursor gas flowing, and also with the second precursor gas flowing in combination with surface microwave plasma conditions within the chamber during the second precursor gas flowing.

In one implementation, an atomic layer deposition method includes the above generically described first and second precursor gas flowings. After the second precursor gas flowing, a third precursor gas different in composition from the first and second precursor gases is flowed to the second monolayer within the chamber effective to react with the second monolayer and form a third monolayer on the substrate which is different in composition from the first and second monolayer. The first, second and third precursor flowings can be successively repeated effective to form a mass of material on the substrate which comprises, consists essentially of or consists of the third monolayer composition. By way of example only in accordance with this implementation, exemplary processing is further described with reference to FIG. 3 in the formation of a third monolayer comprising an aluminum oxide.

Figure 3:
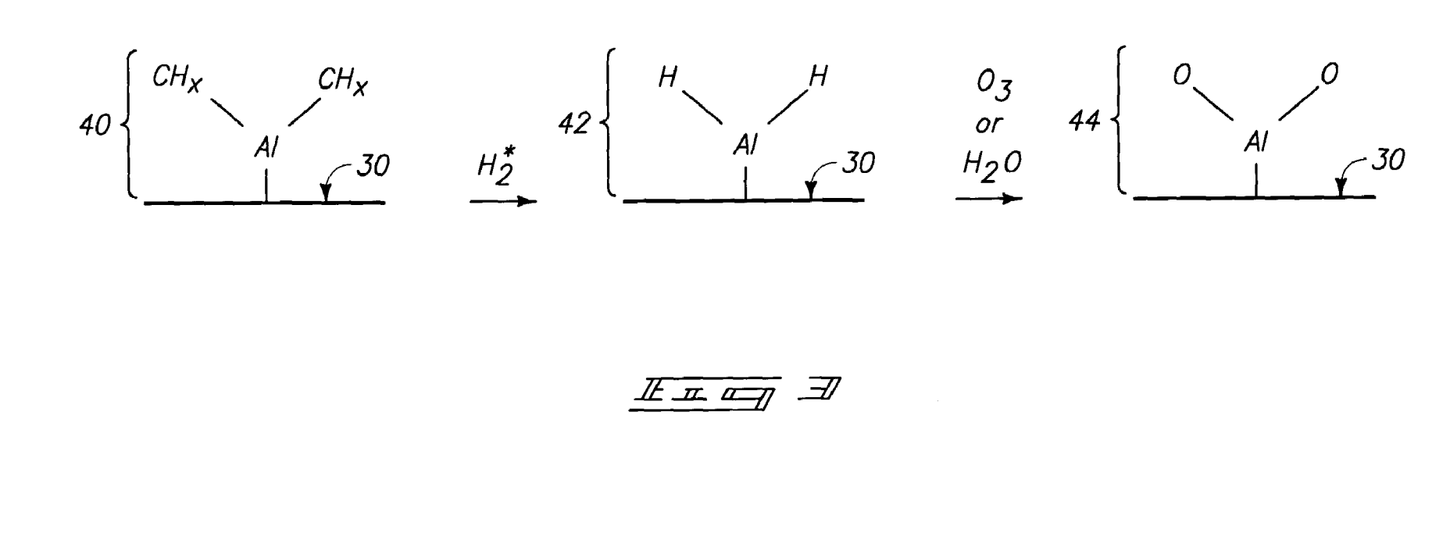
FIG. 3 is a series of diagrammatic molecular level views of an exemplary method in accordance with an aspect of the invention.

Specifically, the far left illustrated view of FIG. 3 depicts the result of flowing a first precursor gas comprising trimethylaluminum to form a first monolayer 40 comprising AlCH$_x$ onto a substrate surface 30. A second precursor gas, for example H$_2$, is flowed to the first monolayer within the chamber under surface microwave plasma conditions within the chamber effective to react with first monolayer 40 and form a different composition second monolayer 42 on the substrate. Illustrated second monolayer 42 comprises a component from first monolayer 40 (Al) and a component from the second precursor (H). A third precursor gas (i.e., O$_3$ and/or H$_2$O) is flowed to second monolayer 42 within the chamber effective to react therewith and form a third monolayer 44 (i.e., AlO$_x$) on substrate 30 which is different in composition from first monolayer 40 and second monolayer 42. Of course, such processing can be repeated to deposit a desired thickness aluminum oxide comprising layer by atomic layer deposition. Further of course, one, both or neither of the first and third precursor gas flowings could comprise remote and/or chamber generated plasma, and for example include surface microwave plasma conditions.

By way of example only and where a desired finished product is TiN, an exemplary alternate first precursor gas is TiCl$_4$ to form a monolayer comprising TiCl$_x$. An exemplary second precursor gas could still comprise H$_2$, with an exemplary third precursor gas comprising NH3. Further by way of example, another deposited material is TaN as the third monolayer. An exemplary first precursor gas is TaCl$_5$ to form the first monolayer to comprise TaClx. An exemplary second precursor gas is H$_2$ and an exemplary third precursor gas is NH$_3$.

In one implementation, processing occurs as described above generically with respect to the first and second precursor gas flowings. After the second precursor gas flowing, the first precursor gas is flowed to the substrate within the chamber effective to react with the second monolayer and both a) remove a component of the second monolayer to form a third composition monolayer on the substrate which is different in composition from the first and second monolayers, and b) form a fourth monolayer of the first monolayer composition on the third composition monolayer. By way of example only, exemplary processing is more specifically described in FIG. 4 in connection with the fabrication of an elemental tantalum layer.

Figure 4:
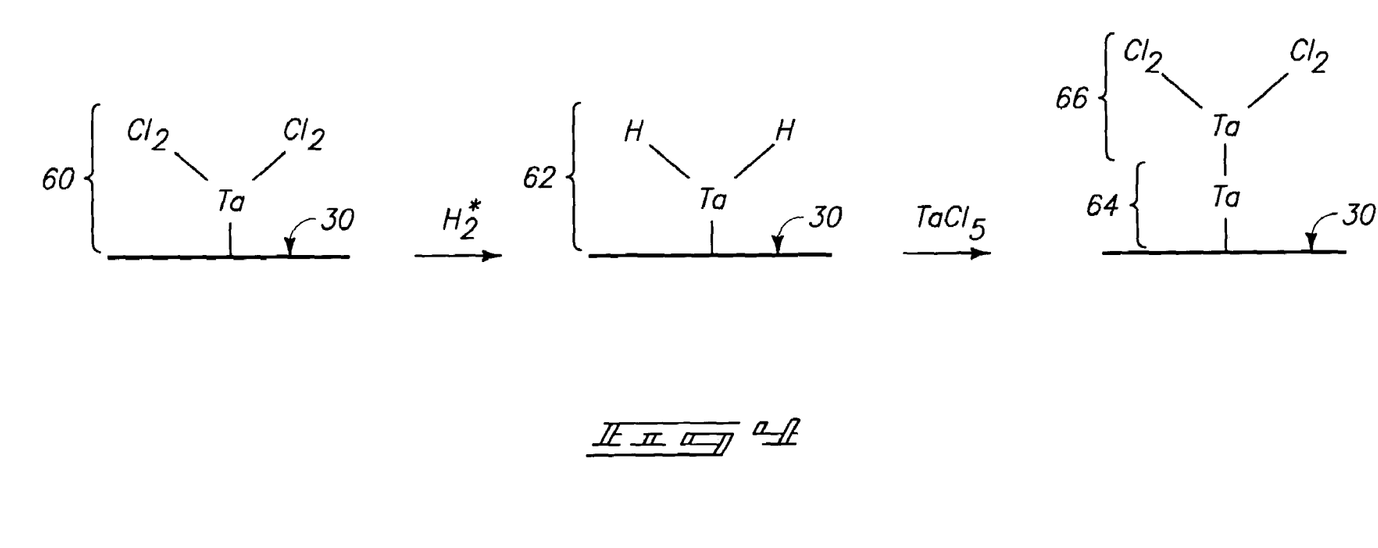
FIG. 4 is a series of diagrammatic molecular level views of an exemplary method in accordance with an aspect of the invention.

The far left illustrated view of FIG. 4 depicts processing after flowing a first precursor gas comprising TaCl$_5$ to form a first monolayer 60 comprising TaCl$_x$ onto a substrate surface 30. This is followed by flowing a second precursor gas (i.e., H$_2$) which is different in composition from the first precursor gas to the first monolayer within the chamber under surface microwave plasma conditions within the chamber effective to react with the first monolayer to form a second monolayer 62 on the substrate which is different in composition from the first monolayer. Second monolayer 62 comprises a component of the first monolayer (i.e., Ta) and a component of the second precursor (i.e., H). Subsequently, the first precursor gas (i.e., TaCl$_5$) is flowed to the substrate within the chamber effective to react with second monolayer 62 to both a) remove a component of the second monolayer (i.e., H) to form a third composition monolayer 64 (i.e., Ta), which is different in composition from first monolayer 60 and second monolayer 62; and b) form a fourth monolayer 66 (i.e., TaCl$_x$) of the first monolayer composition on third composition monolayer 64. Such can be successively repeated to form a mass of material on the substrate comprising, consisting essentially of, or consisting of the third composition monolayer. Again, the first and third precursor flowings can be with or without plasma within the chamber, for example with or without surface microwave plasma.

The depicted and preferred FIG. 4 processing forms the third composition monolayer to comprise a metal in elemental form. By way of example only, alternate exemplary processing for the fabrication of a titanium layer might utilize a first precursor gas comprising TiCl$_4$ to form the first monolayer to comprise TiCl$_x$. In such instance, a preferred exemplary second precursor again comprises H$_2$.

The invention has particular advantageous utility where the first monolayer is of a composition which is substantially unreactive with the second precursor under otherwise identical processing conditions but for presence of surface microwave plasma within the chamber. First monolayers as described above with reference to FIGS. 2-4 can constitute such compositions.

At least with respect to a second precursor gas flowing which is different from the first to form the first monolayer within the chamber under surface microwave plasma conditions, the various above-described processings can provide better uniformity and utilize lower ion energy in facilitating an atomic layer deposition which is plasma enhanced in comparison to higher ion energy plasmas which are not expected to provide as desirable a uniformity.

The above-described processings can occur in any manner as literally stated, for example with or without intervening inert purge gas flowings and under any existing or yet-to-be developed processing parameters. Further by way of example only, the openings within the antenna might be made to be gas transmissive as well as microwave transmissive and the antenna provided with the chamber. In such instance, gas might be flowed through the plurality of openings while transmitting microwave energy through the plurality of openings to the processing chamber effective to form a surface microwave plasma onto a substrate received within the processing chamber. Gas inlets could be configured to flow first to the antennas, and then into the chamber through the openings with the microwave energy which is transmitted through the same openings, or through different openings. Such processing can be void of flowing any gas to the chamber during transmitting of the microwave energy other than through the plurality of openings, if desired.

Further by way of example only, exemplary preferred processing for carrying out the above exemplary methods is described below in conjunction with TiCl$_4$ as a first precursor gas and H$_2$ as a second precursor gas, and utilizing an inert purge gas comprising helium. The below-described preferred embodiments/best modes disclosure for practicing exemplary methods as described above are also considered to constitute independent inventions to those described above, and as are more specifically and separately claimed.

Referring generally to FIGS. 5-9, such essentially depict a common horizontal timeline showing different respective gas pulses separately broken out in the form of a first precursor gas (i.e., TiCl$_4$), an inert purge gas (i.e., He), and a second precursor gas (i.e., H$_2$). The H$_2$ timeline also has associated therewith dashed lines intended to depict the application of energy at least the elevated-most surfaces of which are intended to depict a power level effective to form a plasma of the exemplary H$_2$ gas flowing within the chamber. Such might, and preferably does, constitute surface microwave plasma generation within a suitable chamber, for example as described above in connection with the first above embodiments, although is not so limited with respect to the FIGS. 5-9 embodiments unless found literally in a claim under analysis.

Figure 5:
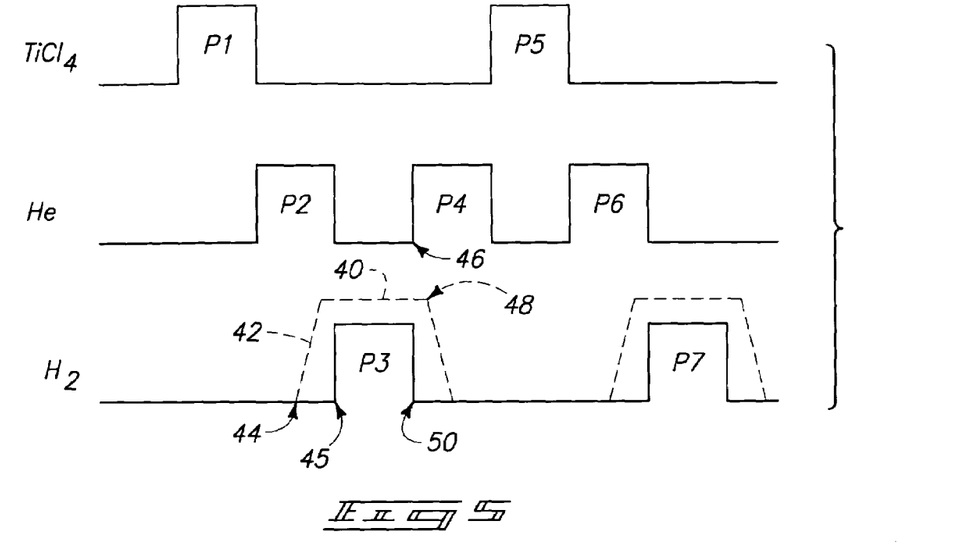
FIG. 5 is a series of common timelines showing exemplary gas flows and power levels of processing in accordance with exemplary aspects of the invention.

Referring initially to FIG. 5, a semiconductor substrate would be positioned within an atomic layer deposition chamber. A first precursor gas is flowed to the substrate within the chamber effective to form a first monolayer on the substrate, for example as depicted by a TiCl$_4$ gas pulse P1. Plasma generation might or might not be utilized. After flowing the first monolayer, an inert purge gas is flowed to the chamber, for example as depicted by a helium gas pulse P2. After flowing the inert purge gas, a second precursor gas is flowed to the substrate under plasma conditions within the chamber effective to form a second monolayer on the substrate which is different in composition from the first monolayer, for example as depicted by an H$_2$ gas pulse P3. The second precursor gas is different in composition from the first precursor gas.

The plasma conditions within the chamber comprise the application of energy to the chamber at some power level 40 capable of sustaining plasma conditions within the chamber with the second precursor gas P3. The application of such energy to the chamber commences along an increasing power level 42 up to plasma capable power level 40 at a time point 44 prior to flowing the second precursor gas to the chamber, for example as depicted at time point 45. In the exemplary depicted FIG. 5 embodiment, the power level increasing along line 42 is continuous, and also preferably at a substantially constant rate. The first monolayer might be formed in the presence or absence of plasma within the chamber. Further in one preferred embodiment in connection with FIGS. 5-9, and for example as described in the initial embodiments, the second monolayer formed may result from a reaction with the first monolayer, with the second monolayer comprising components of the first monolayer and the second precursor. Further in the exemplary FIG. 5 depicted embodiment, inert purge gas flowing P2 and second precursor gas flowing P3 do not overlap. By way of example only, exemplary time periods for all pulses is one second. Although of course, greater, less and/or unequal times could be utilized.

After forming the second monolayer, another inert purge gas flowing P4 (the same or different in composition in some way to that of the first purge gas) is begun prior to commencing a reducing of the plasma capable power. For example, FIG. 5 depicts the P4 pulse commencing at a time point 46 which is before a time point 48 when a reducing from the plasma capable power starts to occur.

In the depicted FIG. 5 embodiment, and by way of example only, second precursor pulse P3 and the other inert purge gas pulse P4 do not overlap. Further, the second precursor gas flowing to the chamber is ceased prior to commencing a reducing of the plasma capable power. By way of example, such is depicted at a time point 50, where the second precursor gas flow is ceased, in comparison with later-in-time point 48 where power begins to reduce from power level 40. The above exemplary processing can be repeated, of course, for example as shown by gas pulses P5, P6 and P7.

Another exemplary embodiment is described with reference to FIG. 6. As with the FIG. 5 embodiment, a semiconductor substrate is positioned within an atomic layer deposition chamber and a first precursor gas is flowed to the substrate within the chamber effective to form a first monolayer on the substrate. Such is depicted by the exemplary P1 TiCl$_4$ pulsing. After forming the first monolayer, a second precursor gas is flowed to the substrate under plasma conditions within the chamber effective to form a second monolayer on the substrate which is different in composition from the first monolayer. The second precursor gas is different in composition from the first precursor gas, and is depicted by P3 as an example only with respect to an exemplary H$_2$ second precursor gas flowing.

Figure 6:
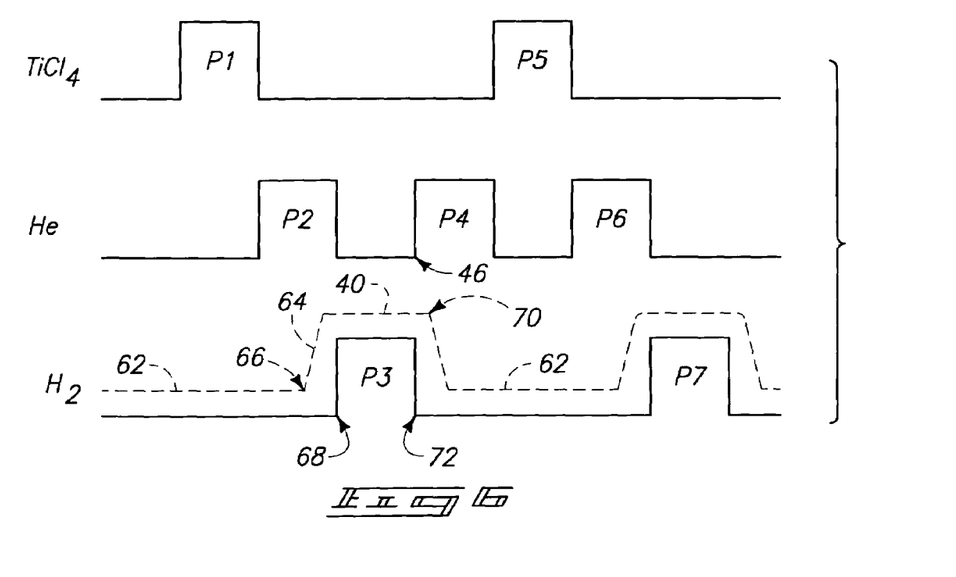
FIG. 6 is an alternate series of common timelines to that depicted by FIG. 5.

In FIG. 6, plasma generation of the second precursor gas within the chamber occurs from a second applied power level of energy 40 to the chamber which is capable of generating plasma within the chamber. Some steady-state, first-applied power level of such energy is applied to the chamber at some point at least prior to applying the second-applied power level of such energy 40. An exemplary steady-state, first-applied power level 62 is depicted in FIG. 6 which is less than second-applied power level 40, with an increasing from first-applied power 62 to second-applied power level 40 occurring along a line 64.

In one preferred embodiment, steady-state first power 62 is insufficient to generate plasma from the flowing second precursor gas. In one preferred embodiment, steady-state first power 62 is insufficient to generate plasma from the flowing first precursor gas. In the depicted exemplary preferred FIG. 6 embodiment, steady-state first power 62 is applied during first precursor flowing P1, and under conditions effective to form a first monolayer on the substrate under non-plasma conditions within the chamber. In one embodiment, first power level 62 can be considered as a base power level of energy.

FIG. 6 also depicts a purge gas flowing P2 to the chamber intermediate first precursor gas flowing P1 and second precursor gas flowing P2, with steady-state first power 62 being applied during purge gas flowing P2. Further, base power level 62 is raised to power level 40 during a portion of inert purge gas flowing P2.

In the preferred FIG. 6 embodiment, a purge gas flowing P4 occurs after the second precursor gas flowing P3, with a return to power level 62 occurring during such purge gas flowing P4 and after a ceasing of flow of second precursor gas P3. The exemplary processing is depicted as being repeated in connection with gas pulses P5, P6 and P7, and provides but one example of depositing one or more additional monolayers onto the second monolayer. FIG. 6 depicts commencing the raising or increasing of the power level at a point in time 66 which is prior to a point in time 68 when second precursor gas flowing P3 begins. Further in the preferred FIG. 6 embodiment, reducing from power level 40 is commenced at a time point 70 which occurs after a time point 72 where second precursor gas pulse P3 flow is ceased.

By way of example only, FIGS. 5 and 6 illustrate exemplary preferred embodiments wherein the respective gas pulses in no way overlap. The invention also contemplates at least some overlapping of the gas pulses, of course. By way of example only, and particularly with reference to the second precursor gas pulsing, exemplary overlappings are described with reference to FIGS. 7-10.

Figure 7:
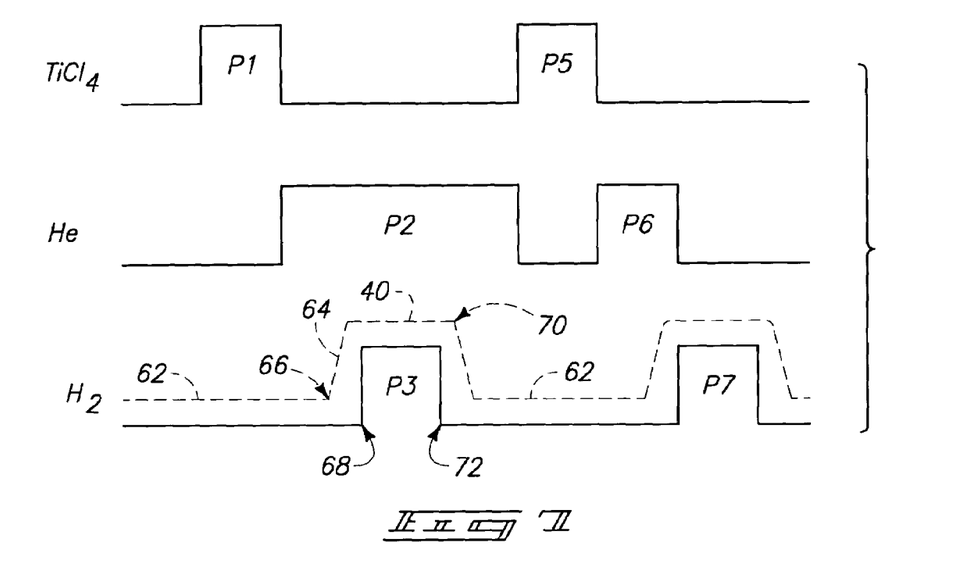
FIG. 7 is another alternate series of common timelines to that depicted by FIG. 5.

Referring initially to FIG. 7, such is the same as FIG. 6 except the inert P2 pulse is extended to continue over the P3 pulse, with the inert P2 pulse flowing ceasing after a ceasing of second precursor gas flowing P3.

Figure 8:
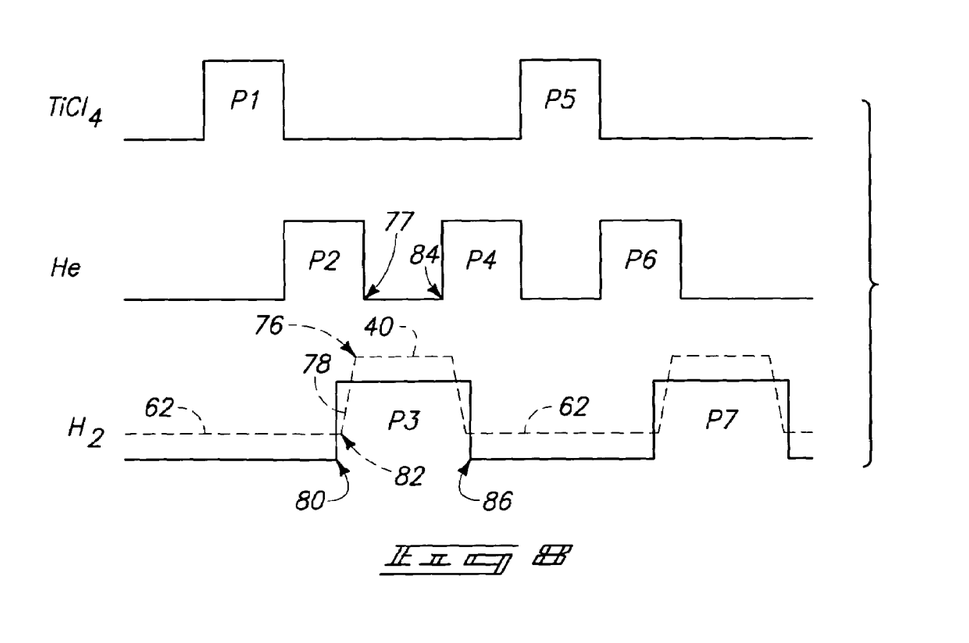
FIG. 8 is still another alternate series of common timelines to that depicted by FIG. 5.

Referring to FIG. 8, a first precursor gas is flowed to the substrate within an atomic layer deposition chamber effective to form a first monolayer on the substrate, for example as depicted with respect to TiCl$_4$ with a gas pulse P1. After forming the first monolayer, an inert purge gas is flowed to the chamber, for example as designated by helium gas pulse P2. After flowing the inert purge gas, a second precursor gas is flowed to the substrate under plasma conditions within the chamber effective to form a second monolayer on the substrate which is different in composition from the first monolayer. In some manner, the second precursor gas is different in composition from the first precursor gas, for example as depicted in FIG. 8 by H$_2$ pulse P3.

As also depicted in FIG. 8, the second precursor gas flowing under plasma conditions within the chamber commences at an exemplary time point 76 before a time point 77 when inert purge gas flow P2 is ceased. Further, inert purge gas flow P2 ceases at the exemplary time point 77 after the commencing and while the second precursor gas flowing under plasma conditions within the chamber is occurring. Further, FIG. 8 depicts that the plasma conditions within the chamber comprise the application of energy to the chamber at a power level 40 which is capable of sustaining plasma conditions within the chamber with the second precursor gas. FIG. 8 also depicts a minimum application of a base power level 62, and a raising therefrom to power level 40 along a segment 78. However also with respect to the FIG. 8 exemplary embodiment, an aspect of the invention contemplates zero power being applied as opposed to some base level 62. Regardless and in a non-limiting fashion, FIG. 8 also depicts second precursor gas pulse P3 commencing at a time point 80 and the power level increasing along line 78 commencing at a time point 82 which is after time point 80.

After forming the second monolayer, another inert purge gas flow P4 is depicted as commencing at a point in time 84 which is prior to a point in time 86 when the second precursor gas flow is ceased. Of course, such processing can be repeated for example as depicted by gas pulses P5, P6 and P7.

Figure 9:
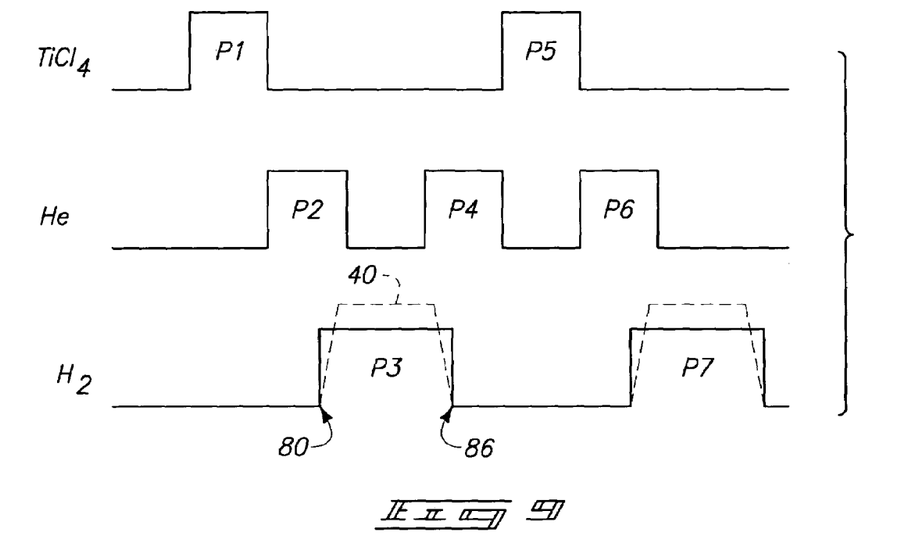
FIG. 9 is yet another alternate series of common timelines to that depicted by FIG. 5.

By way of example only, FIG. 9 depicts an alternate embodiment whereby the commencing of an application of energy to the chamber at the increasing power level up to a plasma capable power level 40 occurs commensurate with point in time 80 constituting the beginning of the flow of the second precursor gas to the chamber. Also by way of example only, FIG. 8 depicts power levels starting from and returning to zero, with the arrival at zero power also occurring at time point 86 when the flow of the second precursor is ceased.

Figure 10:
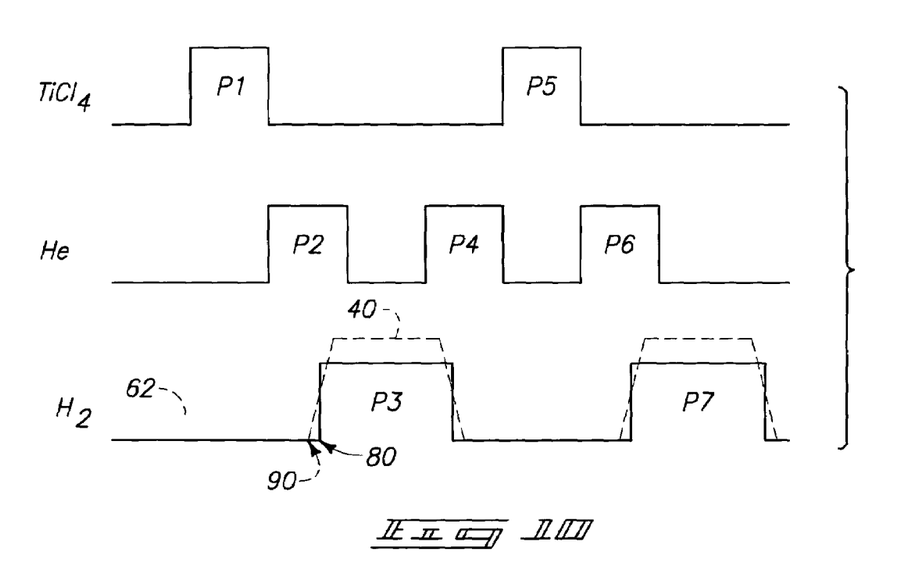
FIG. 10 is another alternate series of common timelines to that depicted by FIG. 5.

Further by way of example only, FIG. 10 depicts a process whereby the application of energy to the chamber at the increasing power level up to power level 40 commences at a time point 90 which is prior to time point 80 when the flow of the second precursor gas to the chamber commences.

By way of example only, plasmas generated from microwaves are typically characterized by a very shallow skin depth, with the power being very effectively consumed in a very small volume. Surface microwave plasma typically results from generation of uniform plasma from microwave by means of distributing or spreading out the microwave energy prior to entry into the reaction chamber. The microwave power is typically converted from a waveguide transmission mode into waves that run parallel to an upper reactor plane antenna/window. This conversion to surface wave is produced by a diverting antenna that acts to reflect the microwaves. Once the microwaves are running parallel to the upper plane antenna, small openings in the plane antenna allow portions of the microwave to be released to the reaction chamber thus spreading the power over the desired area. The periodicity of the openings in the plane antenna determine the locality and uniformity of the power spread.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An atomic layer deposition method, comprising;
providing a semiconductor substrate within an atomic layer deposition chamber;
flowing a first precursor gas to the substrate within the chamber effective to form a first monolayer on the substrate;
after forming the first monolayer, flowing a second precursor gas to the substrate under plasma conditions within the chamber effective to form a second monolayer on the substrate which is different in composition from the first monolayer, the second precursor gas being different in composition from the first precursor gas, plasma generation of the second precursor gas within the chamber occurring from a second applied power of energy to the chamber, and further comprising applying a steady state first applied power of said energy to the chamber prior to applying said second applied power of said energy, the steady state first applied power being less than the second applied power and increasing the first applied power to said second applied power, said increasing commencing prior to commencing the second precursor gas flowing.

2. The method of claim 1 wherein said increasing is continuous.

3. The method of claim 1 wherein the steady state first power is insufficient to generate plasma from flowing the second precursor gas.

4. The method of claim 1 wherein the steady state first power is insufficient to generate plasma from flowing the first precursor gas.

5. The method of claim 1 comprising applying the steady state first power during the first precursor flowing.

6. The method of claim 5 wherein the steady state first power is insufficient to generate plasma from the flowing first precursor gas.

7. The method of claim 1 comprising flowing an inert purge gas to the chamber intermediate the first and second precursor gas flowings.

8. The method of claim 7 comprising applying the steady state first power during the inert purge gas flowing.

9. The method of claim 7 comprising flowing an inert purge gas to the chamber after the second precursor gas flowing, applying the steady state first power during the inert purge gas flowing intermediate the first and second precursor gas flowings and applying the steady state first power during the inert purge gas flowing after the second precursor flowing.

10. The method of claim 1 wherein the plasma conditions comprise surface microwave plasma.

11. The method of claim 1 comprising reducing power to the steady state first power after a ceasing flow of the second precursor gas.

12. The method of claim 1 comprising reducing power to the steady state first power prior to a ceasing flow of the second precursor gas.

13. The method of claim 1 wherein the first precursor gas comprises $TiCl_4$, the first monolayer comprises $TiCl_x$, and the second precursor gas comprises $H_2$.

14. The method of claims 1 wherein the second applied power is not reached until after commencing the flowing of the second precursor gas.

15. An atomic layer deposition method, comprising:
providing a semiconductor substrate within an atomic layer deposition chamber;
applying a base power level of energy to the chamber with the substrate positioned therein;
while applying the base power level of energy, flowing a first precursor gas to the substrate within the chamber effective to form a first monolayer on the substrate under non-plasma conditions within the chamber;
after forming the first monolayer, raising the base power level of said energy to a power level capable of generating plasma within the chamber;
flowing a second precursor gas to the substrate within the chamber while said plasma capable power level of said energy is applied to the chamber effective to form a plasma with said second precursor gas against the first monolayer to form a second monolayer on the substrate which is different in composition from the first monolayer, said raising commencing prior to commencing the second precursor gas flowing; and
after forming the second monolayer, reducing the plasma capable power level of said energy to the base power level and thereafter depositing another monolayer onto the second monolayer.

16. The method of claim 15 wherein said raising is continuous.

17. The method of claim 15 comprising flowing an inert purge gas to the chamber intermediate the first and second precursor gas flowings.

18. The method of claim 17 comprising applying the base power level of energy during the inert purge gas flowing.

19. The method of claim 17 comprising flowing an inert purge gas to the chamber after the second precursor gas flowing, applying the base power level of energy during the inert purge gas flowing intermediate the first and second precursor gas flowings and applying the base power level of energy during the inert purge gas flowing after the second precursor flowing.

20. The method of claim 15 wherein the plasma comprises surface microwave plasma.

21. The method of claim 15 comprising commencing said reducing after a ceasing flow of the second precursor gas.

22. The method of claim 15 comprising commencing said reducing prior to a ceasing flow of the second precursor gas.

23. The method of claim 15 wherein the first precursor gas comprises $TiCl_4$, the first monolayer comprises $TiCl_x$, and the second precursor gas comprises $H_2$.

24. The method of claim 15 wherein the power level capable of generating plasma within the chamber is not reached until after commencing the flowing of the second precursor gas.

* * * * *